United States Patent [19]
Furukawa et al.

[11] Patent Number: 5,373,247
[45] Date of Patent: Dec. 13, 1994

[54] AUTOMATIC FREQUENCY CONTROL METHOD AND CIRCUIT FOR CORRECTING AN ERROR BETWEEN A RECEIVED CARRIER FREQUENCY AND A LOCAL FREQUENCY

[75] Inventors: Hideto Furukawa; Koji Matsuyama; Tomonori Sato, all of Kawasaki, Japan

[73] Assignee: Fujitsu Limited, Kawasaki, Japan

[21] Appl. No.: 10,364

[22] Filed: Jan. 28, 1993

[30] Foreign Application Priority Data

Jan. 30, 1992 [JP] Japan .................................. 4-015420

[51] Int. Cl.⁵ .......................... H03C 3/00; H03D 3/00; H03D 3/20; H04L 27/14
[52] U.S. Cl. ..................... 329/306; 329/308; 329/309; 329/310; 375/81; 375/82; 375/85
[58] Field of Search .................. 331/12, 23; 329/304, 329/306, 307, 308, 309, 305, 310; 375/80, 83, 86, 81, 82

[56] References Cited

U.S. PATENT DOCUMENTS

| | | |
|---|---|---|
| 4,238,739 | 12/1980 | Mosley et al. .............. 329/308 X |
| 4,250,456 | 2/1981 | Shinmyo et al. ............ 375/86 X |
| 4,470,145 | 9/1984 | Williams .................... 329/308 X |
| 5,068,876 | 11/1991 | Yoshikawa et al. ........ 375/86 X |
| 5,260,671 | 11/1993 | Iso et al. .................... 329/307 X |
| 5,282,227 | 1/1994 | Crawford ................... 329/307 X |

FOREIGN PATENT DOCUMENTS 2-109447 4/1990 Japan .

*Primary Examiner*—David Mis
*Attorney, Agent, or Firm*—Staas & Halsey

[57] ABSTRACT

An AFC method is used in a demodulator, which employs a $2^n$-phase phase shift keying modulation system, where n is an integer greater than or equal to two, to correct an error between a received carrier frequency and a local frequency. The AFC method includes the steps of (a) subjecting an intermediate frequency signal of a signal received by the demodulator to a quadrature wave detection to obtain I-axis and Q-axis signals, (b) converting amplitude information of the I-axis and Q-axis signals into phase information which includes frequency information, and (c) correcting the local frequency based on the frequency information included in the phase information.

25 Claims, 9 Drawing Sheets

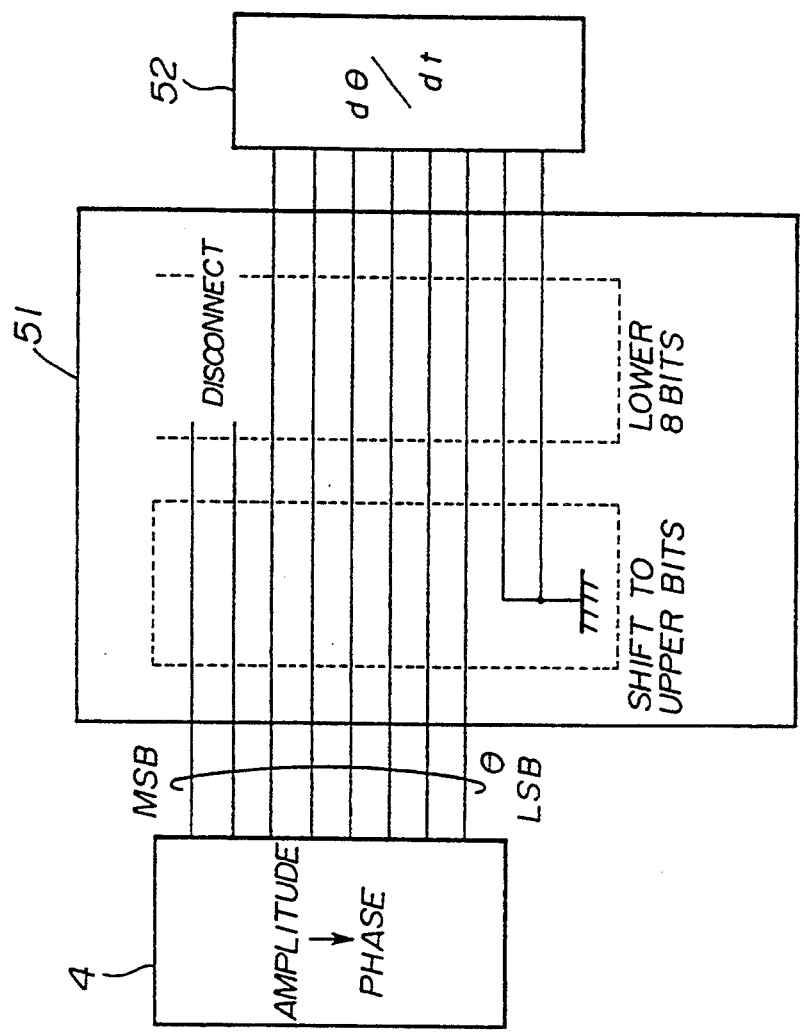

AUTOMATIC FREQUENCY CONTROL METHOD AND CIRCUIT FOR CORRECTING AN ERROR BETWEEN A RECEIVED CARRIER FREQUENCY AND A LOCAL FREQUENCY

BACKGROUND OF THE INVENTION

The present invention generally relates to automatic frequency control methods and circuits. More particularly, the present invention relates to an automatic frequency control method for correcting an error between a received carrier frequency and a local frequency in a demodulator which uses the $2^n$-phase phase shift keying (PSK) modulation system, and to an automatic frequency control circuit which employs such a method.

Recently, communication is frequently made via a satellite, and the value of satellite communications has increased due to the emergence of very small aperture terminals (VSATs). When communicating by satellite, frequency deviation becomes a problem. The frequency shift of the local oscillation frequency of a receiver due to a temperature change, the Doppler effect and the like are the causes of such frequency deviation. Frequency deviation similarly occurs in mobile communications.

Accordingly, the frequency (reference carrier frequency) of a local oscillator of a demodulator must follow the frequency deviation. An automatic frequency control (AFC) loop is provided for this purpose.

FIG. 1 generally shows an example of a conventional AFC circuit of a demodulator which uses the general $2^n$-phase PSK modulation system, where n is an integer greater than or equal to two. An input signal is passed through a mixer 11 and a bandpass filter 12 to convert the input signal into an intermediate frequency (IF) signal. This IF signal is separated into digital I-axis and Q-axis signals by a quadrature wave detector 13. The frequencies of the I-axis and Q-axis signals are multiplied by $2^n$ by a $2^n$-frequency multiplier 14 so as to eliminate unwanted modulation data. Furthermore, a frequency discriminator 20 discriminates the frequency deviation, and a digital loop filter (lowpass filter) 21 limits the frequency band (noise elimination). Thereafter, a digital-to-analog (D/A) converter 22 converts an output of the digital loop filter 21 into an analog signal, to generate a local frequency control voltage for a local oscillator which is provided with respect to the mixer 11 or the quadrature wave detector 13. FIG. 1 shows a case where a local oscillator 25 is provided with respect to the quadrature wave detector 13, but as an alternative, it is possible to provide the local oscillator 25 with respect to the mixer 11. In the latter case, no oscillator is provided with respect to the quadrature wave detector 13.

The frequency discriminator 20 includes delay circuits 15 and 16 for respectively delaying the I-axis and Q-axis signals by one symbol $\tau$ (clock), a multiplier 17 for multiplying the I-axis signal and the delayed I-axis signal, a multiplier 18 for multiplying the Q-axis signal and the delayed Q-axis signal, and a subtractor 19 for calculating an output difference between the multipliers 17 and 18.

The delay operations of the delay circuits 15 and 16 of the frequency discriminator 20 are carried out in response to a clock which is received from a symbol timing reproducing circuit (not shown) at a timing when an eye pattern of the received signal is most open.

The output amplitude of the frequency discriminator 20 changes depending on the frequency deviation, and a frequency pull-in is carried out by the AFC operation.

However, according to the conventional AFC circuit, the frequency is multiplied by $2^n$ in the frequency multiplier by subjecting the amplitude information to an operation, and in addition, the error information of the frequency is extracted using the multipliers. For this reason, there is a problem in that the circuit scale of the AFC circuit inevitable becomes large.

SUMMARY OF THE INVENTION

Accordingly, it is a general object of the present invention to provide a novel and useful AFC method and an AFC circuit, in which the problem described above is eliminated.

Another and more specific object of the present invention is to provide an AFC method for correcting an error between a received carrier frequency and a local frequency, which is controlled by a local oscillator, in a demodulator which employs a $2^n$-phase phase shift keying modulation system, where n is an integer greater than or equal to two. The AFC method comprises the steps of (a) subjecting an intermediate frequency signal of a signal received by the demodulator to a quadrature wave detection so as to obtain I-axis and Q-axis signals, (b) converting amplitude information, such as amplitude components, of the I-axis and Q-axis signals into phase information, such as phase components, after "information"; which includes frequency information, such as frequency components, after "information,"; and (c) correcting the local frequency based on the frequency information included in the phase information. According to the AFC method of the present invention, it is possible to reduce the scale of the circuits which carry out the frequency discrimination and multiplying functions. Furthermore, the frequency discrimination characteristic of the present invention is such that it is possible to obtain a larger output voltage at parts where the frequency deviation is large.

Still another object of the present invention is to provide an AFC circuit for correcting an error between a received carrier frequency and a local frequency, in a demodulator which employs a $2^n$-phase phase shift keying modulation system, where n is an integer greater than or equal to two. The AFC circuit comprises quadrature a wave detector for subjecting an intermediate frequency signal of a signal received by the demodulator to a quadrature wave detection so as to output I-axis and Q-axis signals; a first circuit, coupled to the quadrature wave detector, for converting amplitude information of the I-axis and Q-axis signals into phase information which includes frequency information; a second circuit, coupled to the first circuit, for converting the phase information into the frequency information; and a third circuit, coupled to the second circuit, for correcting the local frequency depending on the frequency information obtained in the second circuit. According to the AFC circuit of the present invention, it is possible to reduce the scale of the circuits which carry out the frequency discrimination and multiplying functions. Furthermore, the frequency discrimination characteristic of the present invention is such that it is possible to obtain a larger output voltage at parts where the frequency deviation is large.

Other objects and further features of the present invention will be apparent from the following detailed description when read in conjunction with the accompanying drawings.

BRIEF DESCRIPTION OF THE DRAWINGS

FIG. 9 is a system block diagram showing an embodiment of a multiplier; and

DESCRIPTION OF THE PREFERRED EMBODIMENTS

First, a description will be given of the operating principle of the present invention.

Figure 2:
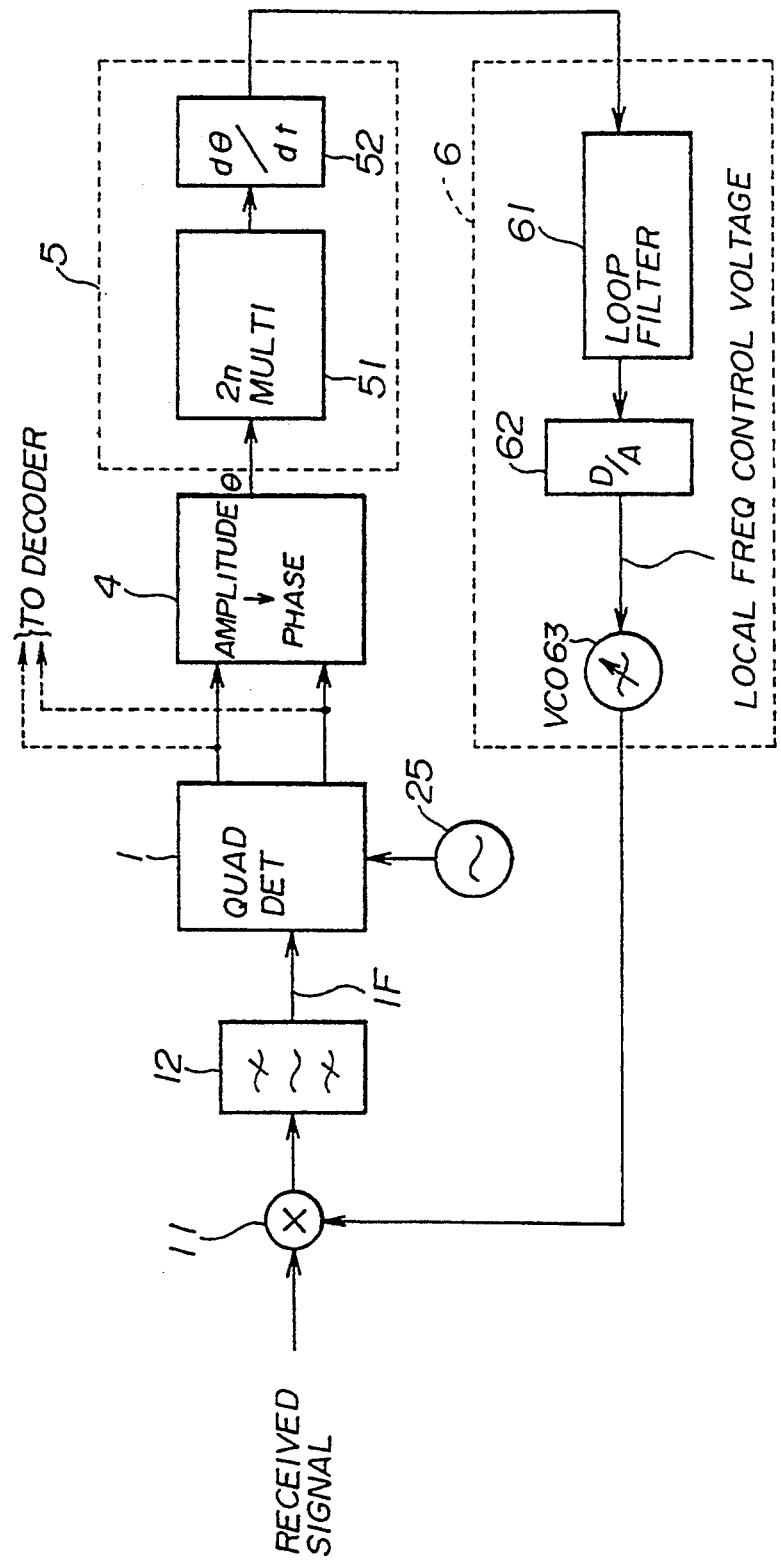
FIG. 2 is a system block diagram showing an essential part of a first embodiment of an AFC circuit according to the present invention.
Figure 3:
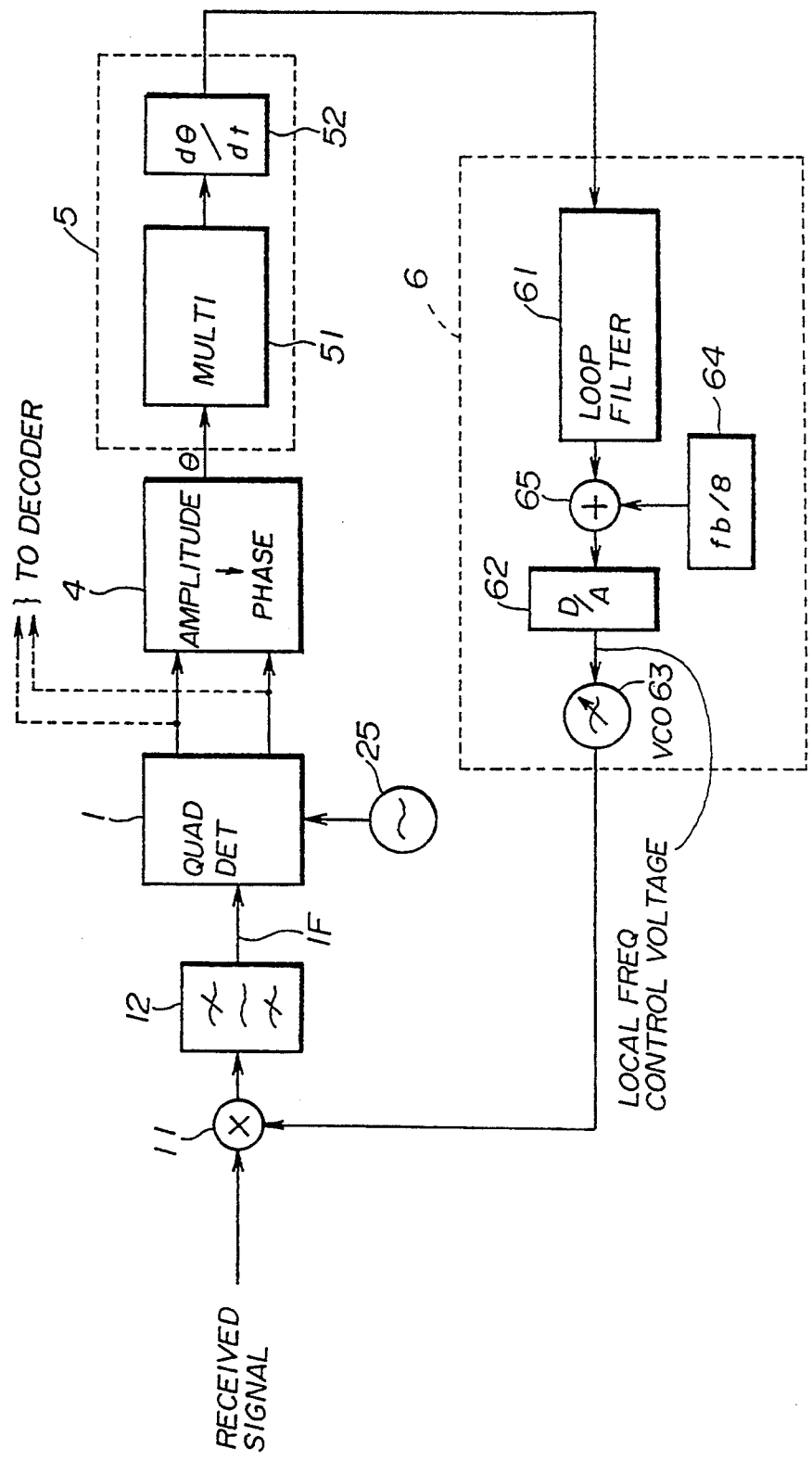
FIG. 3 is a system block diagram showing an essential part of a second embodiment of the AFC circuit according to the present invention.

As may be seen from FIGS. 2 and 3, according to one aspect of the present invention, an AFC circuit generally includes a quadrature wave detector 1 for subjecting an IF signal of the received signal to a quadrature wave detection, a first circuit 4 for converting amplitude information of digital I-axis and Q-axis signals which are obtained by the quadrature wave detection into phase information, such as phase components, which includes frequency information, such as frequency components, a second circuit 5 for converting the phase information into the frequency information, and a third circuit 6 for correcting the local frequency depending on the frequency information.

Figure 4:
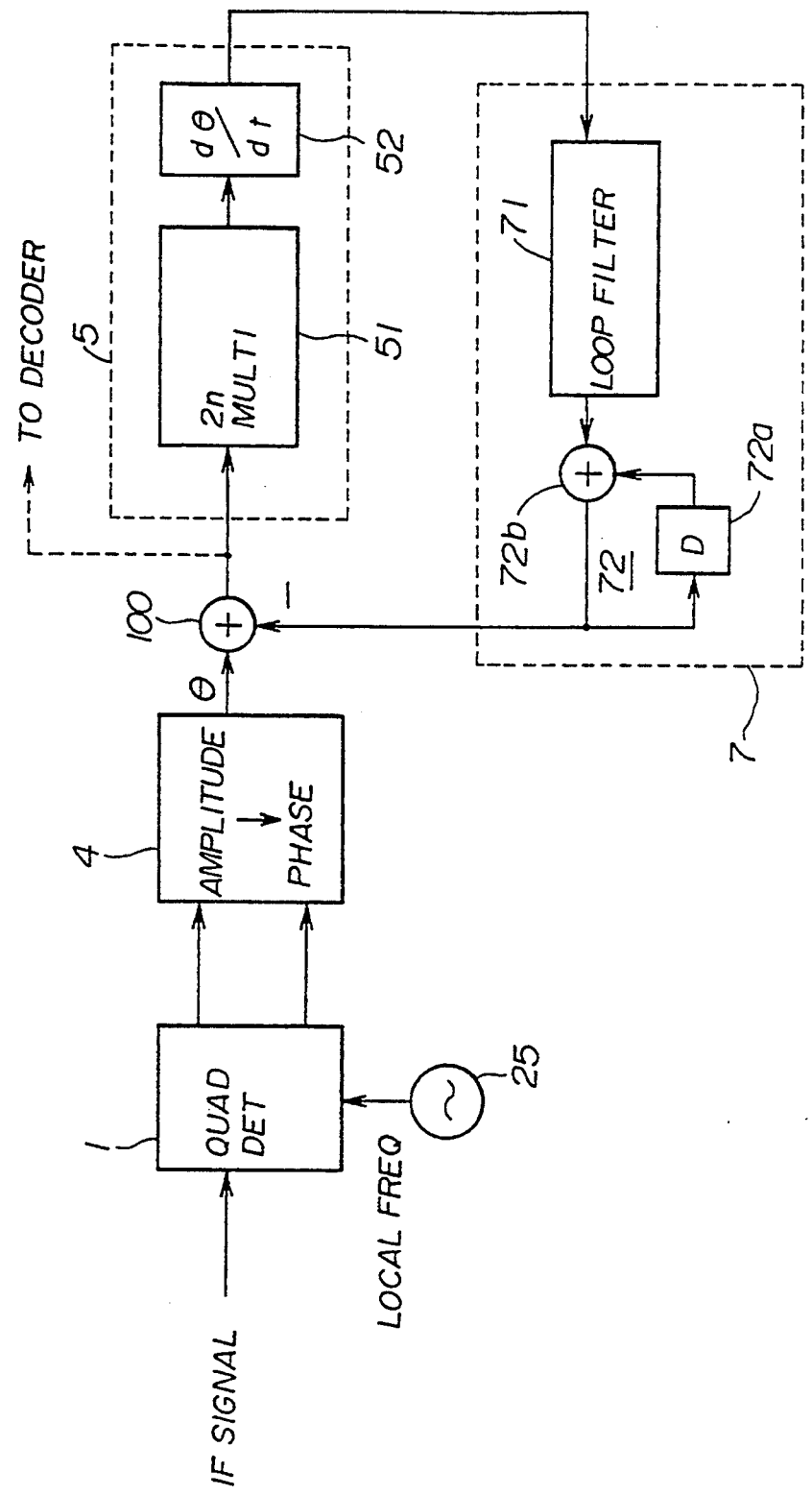
FIG. 4 is a system block diagram showing an essential part of a third embodiment of the AFC circuit according to the present invention.
Figure 5:
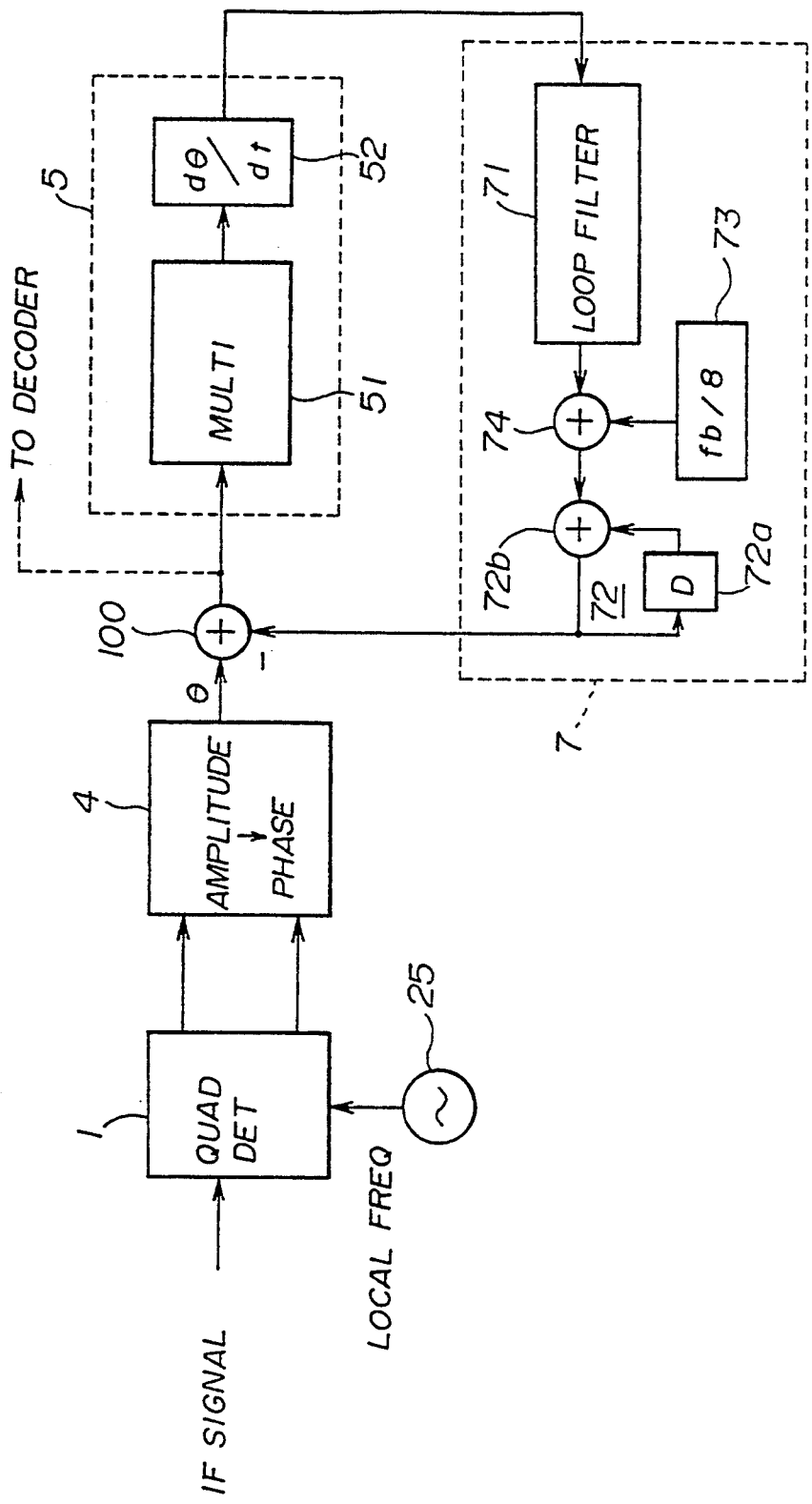
FIG. 5 is a system block diagram showing an essential part of a fourth embodiment of the AFC circuit according to the present invention.

On the other hand, as may be seen from FIGS. 4 and 5, according to another aspect of the present invention, an AFC circuit includes a quadrature wave detector 1 for subjecting an IF signal of the received signal to a quadrature wave detection by the local frequency, a first circuit 4 for converting amplitude information of digital I-axis and Q-axis signals which are obtained by the quadrature wave detection into phase information which includes frequency information, a second circuit 5 for converting the phase information into the frequency information, and a third circuit 7 for correcting the phase information from the first circuit 4 by integrating the frequency information and returning it to the phase information.

The local frequency is the local frequency of a mixer for generating the IF signal or the local frequency of the quadrature wave detector 1.

Therefore, according to the present invention, it is possible to reduce the scale of the circuits which carry out the frequency discrimination and multiplying functions.

Figure 1:
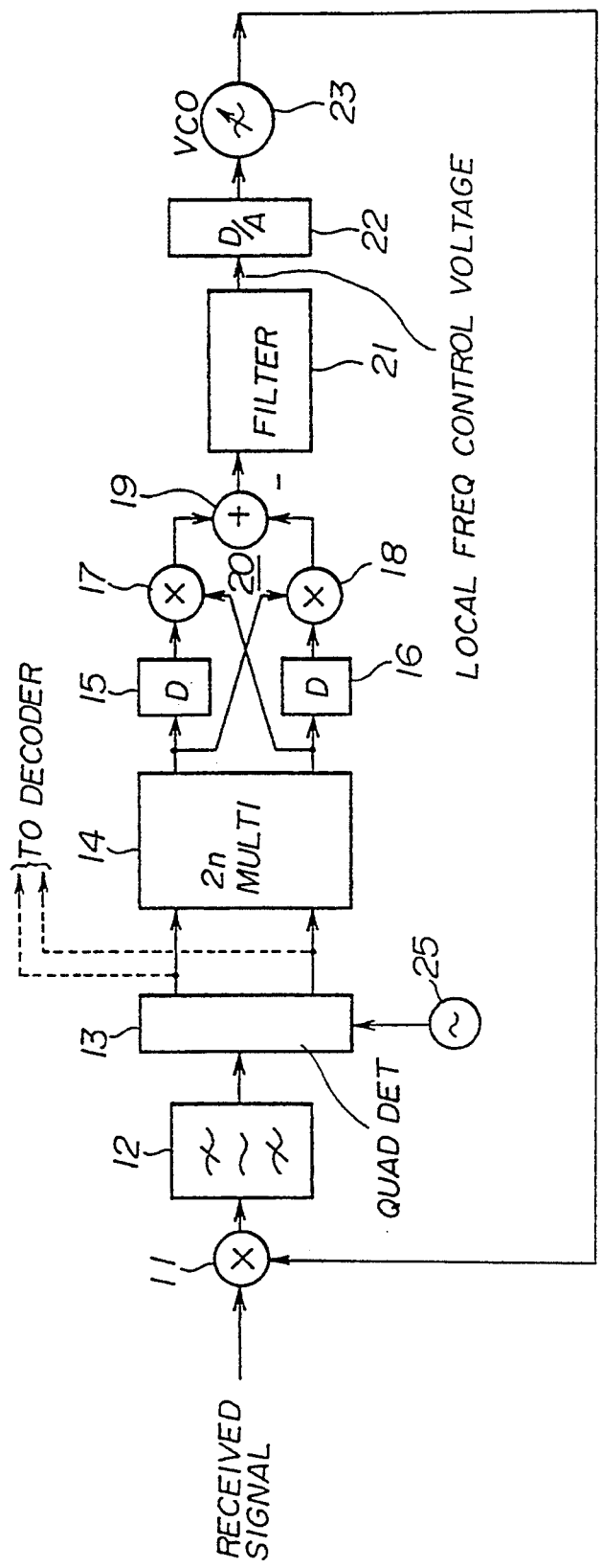
FIG. 1 is a system block diagram generally showing an example of a conventional AFC circuit of a demodulator.

FIG. 2 shows a first embodiment of the AFC circuit according to the present invention. In FIG. 2, those parts which are the same as those corresponding parts in FIG. 1 are designated by the same reference numerals, and a description thereof will be omitted.

In FIG. 2, the first circuit 4 is made up of a frequency-to-phase converter. The second circuit 5 is made up of a $2^n$-frequency multiplier 51 and a differentiating circuit 52 which are connected in series. The third circuit 6 is made up of a loop filter 61, a D/A converter 62 for converting an output signal of the loop filter 61 into an analog signal, and a voltage controlled oscillator (VCO) 63 for correcting the local frequency by the output analog signal of the D/A converter 62. The loop filter 61, the D/A converter 62 and the VCO 63 are connected in series.

The received signal is converted into the IF signal via the mixer 11 and the bandpass filter 12. The IF signal is subjected to a quadrature wave detection in the quadrature wave detector 1, and is converted into digital I-axis and Q-axis signals in the base band. Then, the first circuit 4 converts the amplitude information of the I-axis and Q-axis signals into the phase information which includes the frequency information.

In the first circuit 4, an operation described by the following formula (1) is carried out with respect to the incoming I-axis and Q-axis signals, where I and Q respectively denote the I-axis and Q-axis signals. Hence, the amplitude information of the I-axis and Q-axis signals is converted into the phase information which is related to the phase $\theta$ and includes the frequency information.

$$\theta = \tan^{-1}(Q/I) \quad (1)$$

Then, the second circuit 5 converts the phase information so that only the frequency information of the phase information is extracted.

Figure 6:
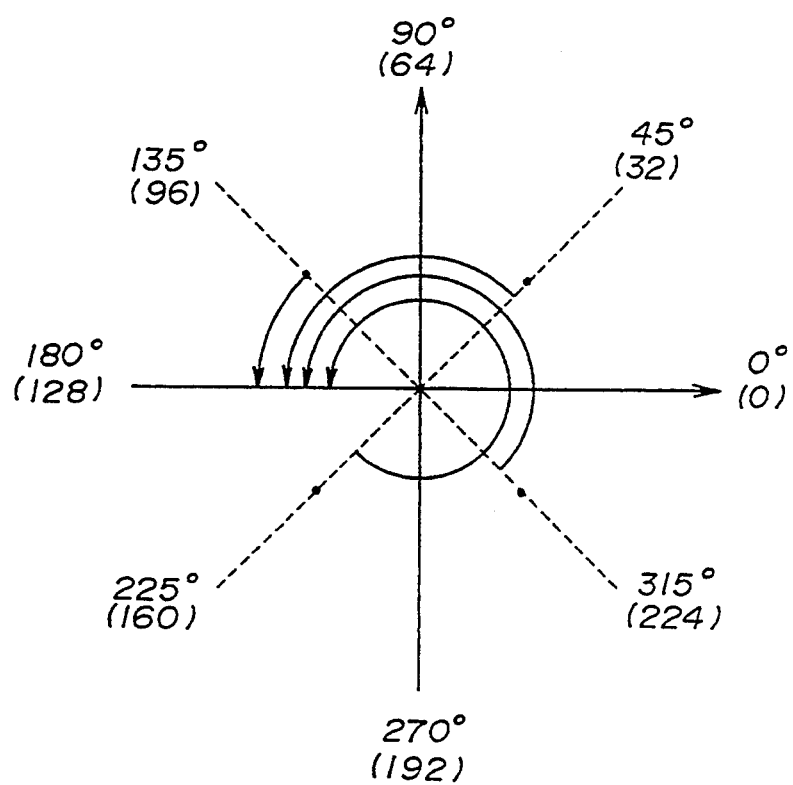
FIG. 6 is a diagram for explaining the operation of a 4-frequency multiplier.

Desirably, the second circuit 5 includes the $2^n$-frequency multiplier 51 and the differentiating circuit 52 as shown in FIG. 2. Because the input data includes only the data of the I-axis and the Q-axis, the data is obtained at the four phase points of 45°, 135°, 225° and 315° as shown in FIG. 6. These four phase points change at random if the data is modulated, but the data can be collected at the phase of 180° by multiplying the frequency by $2^n$ in the $2^n$-frequency multiplier 51, eliminating the modulated data. When the differentiating circuit 52 differentiates the output of the $2^n$-frequency multiplier 51 the phase information is eliminated as a constant, and only the frequency information included in the phase information is output from the differentiating circuit 52.

The frequency information output from the second circuit 5 is converted into information for correcting the local frequency by the third circuit 6. In other words, the error between the received carrier frequency and the local frequency is corrected.

The third circuit 6 is desirably a series circuit including the loop filter 61, the D/A converter 62 and the VCO 63. The frequency information from the second circuit 5 is passed through the loop filter (lowpass filter) 61 to limit the band, that is, eliminate the noise. Then, the D/A converter 62 converts the output of the loop filter 61 into an analog local frequency control voltage. This analog local frequency control voltage is supplied to the VCO 63 which outputs a control voltage for controlling the local oscillator 25 which is provided with respect to the mixer 11 or the quadrature wave detector 1. FIG. 2 shows a case where the local oscillator 25 is provided with respect to the quadrature wave detector 1, but as an alternative, it is possible to provide the local oscillator 25 with respect to the mixer 11, similarly as in the case of FIG. 1. In the latter case, no oscillator is provided with respect to the quadrature wave detector 1.

FIG. 3 shows a second embodiment of the AFC circuit according to the present invention. In FIG. 3, those parts which are the same as those corresponding parts in FIG. 2 are designated by the same reference numerals, and a description thereof will be omitted.

This embodiment is effective when the $2^n$-phase PSK modulation system is the $\pi/4$-shift quadrature PSK (QPSK) modulation system. As shown in FIG. 3, the second circuit 5 is made up of a 4-frequency multiplier 51 and the differentiating circuit 52. Furthermore, the third circuit 6 additionally includes an offset unit 64 and an adder 65. The offset means 64 gives the output signal of the loop filter 61 an offset of $\frac{1}{8}$ the symbol rate fb because the adder 65 adds the output signals of the loop filter 61 and the offset unit 64.

The $\pi/4$-shift QPSK modulation system is a modification of the QPSK modulation system. For this reason, the number of phase points for the $\pi/4$-shift QPSK modulation system is not $2^n$ but $2 \times 2^n$ (that is, eight). For this reason, it is necessary to multiply the frequency by $2 \times 2^n$.

However, if an 8-frequency multiplier were used for the frequency multiplier 51, the pull-in range of the frequency becomes $\frac{1}{2}$ that for the case of the QPSK modulation system. For this reason, this embodiment uses the 4-frequency multiplier 51 so that there are four phase points before the 4-frequency multiplier 51. As a result, by adding to the output signal of the loop filter 61 the offset signal from the offset unit 64 which is $\frac{1}{8}$ the symbol rate fb, it becomes possible to realize the $\pi/4$-shift QPSK modulation system which is obtained by shifting the phase points of the QPSK modulation system by $360/8 = \pi/4$.

FIG. 4 shows a third embodiment of the AFC circuit according to the present invention. In FIG. 4, those parts which are the same as those corresponding parts in FIG. 2 are designated by the same reference numerals, and a description thereof will be omitted.

In this embodiment, a third circuit 7 is used in place of the third circuit 6 which is used in the first and second embodiments shown in FIGS. 2 and 3. The third circuit 7 integrates the frequency information from the second circuit 5, and carries out a correction with respect to the phase information which is received from the first circuit 4.

The third circuit 7 is desirably made up of a series circuit including a loop filter 71 and an integrating circuit 72. The loop filter 71 limits the band of the output signal of the second circuit 5. The integrating circuit 72 is made up of a delay circuit 72a and an adder 72b, and integrates the output signal of the loop filter 71 so as to return the frequency information to the phase information. This phase information output from the third circuit 7 is added to the phase information which is output from the first circuit 4 by an adder 100. As a result, it is possible to correct the error between the received carrier frequency and the local frequency of the phase information.

FIG. 5 shows a fourth embodiment of the AFC circuit according to the present invention. In FIG. 5, those parts which are the same as those corresponding parts in FIG. 4 are designated by the same reference numerals, and a description thereof will be omitted.

This embodiment is effective when the $2^n$-phase PSK modulation system is the $\pi/4$-shift QPSK modulation system. As shown in FIG. 5, the second circuit 5 is made up of a 4-frequency multiplier 51 and the differentiating circuit 52. Furthermore, the third circuit 7 additionally includes an offset unit 73 and an adder 74. The offset unit 73 gives the output signal of the loop filter 71 an offset of $\frac{1}{8}$ the symbol rate fb because the adder 74 adds the output signals of the loop filter 71 and the offset unit 73, similarly to the third circuit 6 of the second embodiment shown in FIG. 3.

Next, a description will be given of an embodiment of the quadrature wave detector 1 which may be used in any of the first through fourth embodiments of the AFC circuit shown in FIGS. 2 through 5, by referring to FIG. 7.

Figure 7:
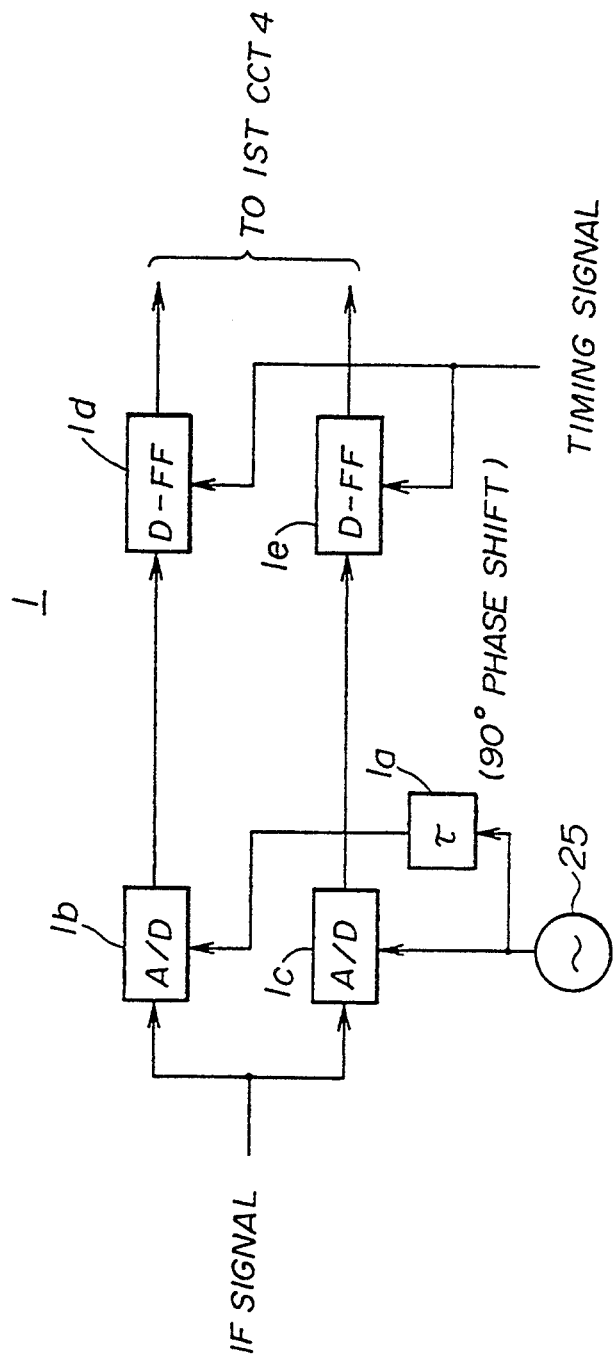
FIG. 7 is a system block diagram showing an embodiment of a quadrature wave detector.

The quadrature wave detector 1 shown in FIG. 7 includes a phase shifter 1a, analog-to-digital (A/D) converters 1b and 1c, and D-type flip-flops 1d and 1e which are connected as shown. The phase shifter 1a shifts the output signal (pulse) of the local oscillator 25 by 90°. The A/D converter 1b converts the IF signal into a digital signal based on the output signal of the phase shifter 1a. On the other hand, the A/D converter 1c converts the IF signal into a digital signal based on the output signal of the (analog type) local oscillator 25. Hence, the output digital signals of the A/D converters 1b and 1c have a phase difference of 90°. The flip-flops 1d and 1e respectively match the timings of the digital signals output from the A/D converters 1b and 1c, and output these digital signals.

Figure 8:
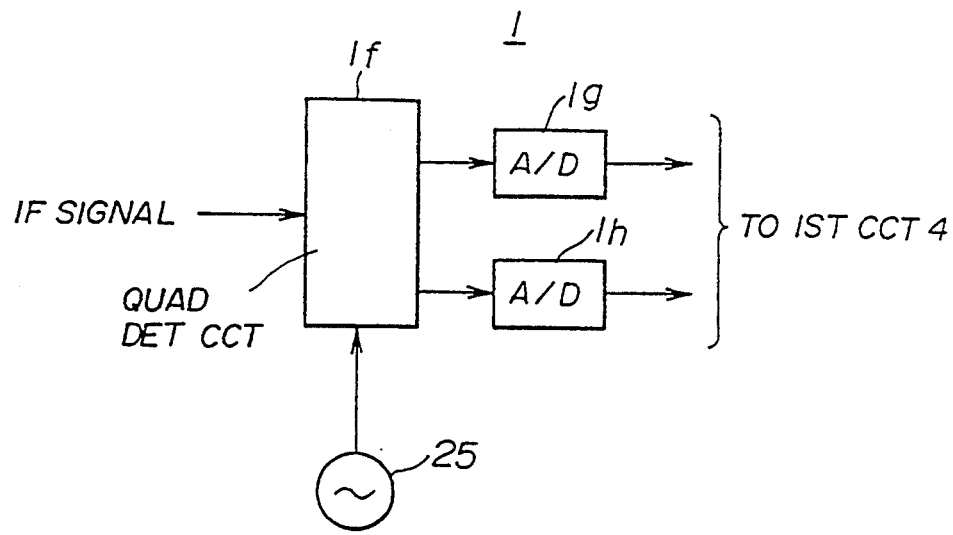
FIG. 8 is a system block diagram showing another embodiment of the quadrature wave detector.

FIG. 8 shows another embodiment of the quadrature wave detector 1. The quadrature wave detector 1 shown in FIG. 8 includes a quadrature wave detection circuit 1f, and A/D converters 1g and 1h which are connected as shown. The quadrature wave detection circuit 1f converts the IF signal into two analog signals having a phase difference of 90° based on the output signal of the (analog type) local oscillator 25. The A/D converters 1g and 1h respectively convert the output analog signals of the quadrature wave detection circuit 1f into corresponding digital signals.

Next, a description will be given of an embodiment of the frequency multiplier 51 which may be used in any of the first through fourth embodiments of the AFC circuit shown in FIGS. 2 through 5, by referring to FIG. 9.

FIG. 9 shows the case where the frequency multiplier 51 is a 4-frequency multiplier. If the phase information output from the first circuit 4 is an 8-bit signal, the frequency multiplier 51 shifts the bits of this 8-bit signal by 2 bits towards the most significant bit (MSB). In other words, if the phase information output from the first circuit 4 has 8 bits, the 360° phase shown in FIG. 6 is quantized by dividing it into 256 (=2) divisions in correspondence with the 8 bits.

In the case of the QPSK modulation system, the phase points are 45°, 135°, 225° and 315° as shown in FIG. 6. Hence, the data become collected to the phase point of 180° when the frequency is multiplied by 4 in the frequency multiplier 51. In order to carry out this operation, the output signal Y of the 4-frequency multiplier 51 can be described by the following formula (2) if the phase information output from the first circuit 4 is denoted by X (8 bits).

$$Y = 4 \times X \bmod 256 \quad (2)$$

The following Table shows the values of the output signal Y which are obtained by substituting numerical values into the formula (2). As may be seen from the Table, the value of the output signal Y becomes "128" for all cases, which means that this corresponds to the phase point of 180° in FIG. 6.

TABLE

| Angle | Xmod 256 | 4 × X | Y |
| --- | --- | --- | --- |
| 45° | 32 | 128 | 128 |
| 135° | 96 | 384 | 128 |
| 225° | 160 | 640 | 128 |
| 315° | 224 | 896 | 128 |

When the operation described by the formula (2) is realized by a digital circuit, a frequency multiplication by 4 can be realized by shifting the bits by two bits towards the MSB. On the other hand, since "mod256" means extraction of the lower 8 bits, the construction of the 4-frequency multiplier 51 becomes as shown in FIG. 9.

In the case of the $2^n$-phase PSK modulation system, the $2^n$-frequency multiplication can be realized by shifting the bits by n bits towards the MSB and extracting the lower m bits (if 360° is quantized by $2^m$).

Next, a description will be given of the effects of the present invention other than the effect of reducing the circuit scale of the circuitry required to form the AFC circuit, by referring to FIG. 10.

Figure 10:
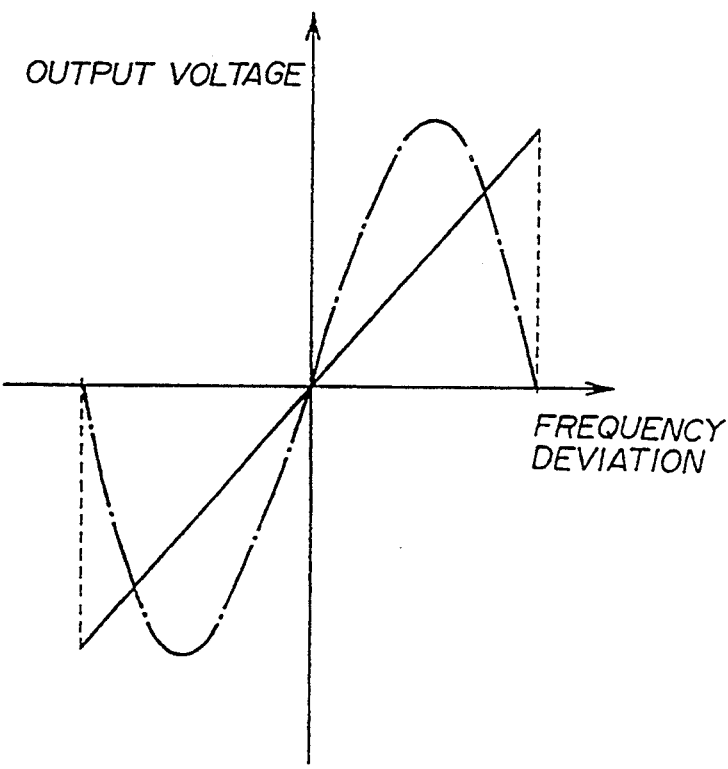
FIG. 10 shows frequency discrimination characteristics for explaining the effects of the present invention.

Conventionally, the frequency discrimination characteristic of the frequency discriminator 20 has a sinusoidal form as indicated by a one-dot chain line in FIG. 10, where the abscissa indicates the frequency deviation of the input signal of the frequency discriminator 20 and the ordinate indicates the output voltage of the frequency discriminator.

But according to the present invention, the frequency discrimination characteristic of the frequency discriminator which is in effect formed by the first and second circuits 4 and 5 becomes linear as indicated by a solid line in FIG. 10. For this reason, although the frequency pull-in range of the two frequency discrimination characteristics shown in FIG. 10 are approximately the same, the frequency discrimination characteristic of the present invention can obtain a larger output voltage at parts where the frequency deviation is large. Therefore, the present invention can effectively prevent an erroneous operation of the AFC circuit such as a hang-up.

Further, the present invention is not limited to these embodiments, but various variations and modifications may be made without departing from the scope of the present invention.

What is claimed is:

1. An automatic frequency control method, of a demodulator which employs a $2^n$-phase phase shift keying modulation technique, where n is an integer greater than or equal to two, for correcting an error between a received carrier frequency and a local frequency, said automatic frequency control method comprising the steps of:
   (a) subjecting an intermediate frequency signal of a signal received by the demodulator to a quadrature wave detection to obtain I-axis and Q-axis signals;
   (b) converting amplitude components of the I-axis and Q-axis signals into phase components which includes frequency components; and
   (c) correcting the local frequency based on the frequency components included in the phase components.

2. The automatic phase control method as claimed in claim 1, wherein said step (c) includes steps of:
   (c1) converting the phase components into the frequency components; and
   (c2) correcting the local frequency depending on the frequency components obtained in said substep (c1).

3. The automatic phase control method as aimed in claim 2, wherein said step (c1) includes steps of:
   (c11) multiplying the frequency components of the phase by $2^n$; and
   (c12) differentiating a result obtained by the multiplication in said substep (c11).

4. The automatic frequency control method as claimed in claim 3, wherein said step (a) obtains digital I-axis and Q-axis signals, and said step (c2) includes the substeps of:
   (c21) filtering a result obtained by the differentiation in said substep (c12);
   (c22) converting a result obtained by the filtering in said substep (c21) into an analog signal; and
   (c23) correcting the local frequency based on the analog signal obtained in said substep (c22).

5. The automatic frequency control method as claimed in claim 2, wherein the demodulator employs a $\pi/4$-shift quadrature phase shift keying modulation system which is a modification of the $2^n$-phase phase shift keying modulation system, and said step (c1) includes the substeps of:
   (c11) multiplying the frequency components of the phase components by 4; and
   (c12) differentiating a result obtained by the multiplication in said substep (c11).

6. The automatic frequency control method as claimed in claim 5, wherein said step (a) obtains digital I-axis and Q-axis signals, and said step (c2) includes the substeps of:
   (c21) filtering a result obtained by the differentiation in said substep (c12);
   (c22) offsetting a result obtained by the filtering in said substep (c21) by ½ of a symbol rate;
   (c23) converting an offset result obtained in said substep (c22) into an analog signal; and
   (c24) correcting the local frequency based on the analog signal obtained in said substep (c23).

7. The automatic frequency control method as claimed in claim 1, wherein said step (c) includes steps of:
   (c1) converting the phase components into the frequency components; and
   (c2) integrating the frequency components back into the phase components and correcting the phase components obtained in said step (b) by the phase components obtained in said substep (c2).

8. The automatic phase control method as claimed in claim 7, wherein said step (c1) includes the substeps of:
   (c11) multiplying the frequency components of the phase components by $2^n$; and
   (c12) differentiating a result obtained by the multiplication in said substep (c11).

9. An automatic frequency control method as claimed in claim 8, wherein said step (a) obtains digital I-axis and Q-axis signals, and said step (c2) includes the substeps of:
- (c21) filtering a result obtained by the differentiation in said substep (c12); and
- (c22) integrating a result obtained by the filtering in said substep (c21) to generate the phase components.

10. The automatic phase control method as claimed in claim 7, wherein the demodulator employs a $\pi/4$-shift quadrature phase shift keying modulation system which is a modification of the $2^n$-phase phase shift keying modulation system, and said step (c1) includes the substeps of:
- (c11) multiplying the frequency components of the phase components by 4; and
- (c12) differentiating a result obtained by the multiplication in said substep (c11).

11. An automatic frequency control method as claimed in claim 10, wherein said step (a) obtains digital I-axis and Q-axis signals, and said step (c2) includes the substeps of:
- (c21) filtering a result obtained by the differentiation in said substep (c12); and
- (c22) offsetting a result obtained by the filtering in said substep (c21) by $\frac{1}{8}$ of a symbol rate; and
- (c23) integrating an offset result obtained in said substep (c22) to generate the phase components.

12. The automatic frequency control method as claimed in claim 1, wherein the local frequency comprises a local frequency of a mixer which generates the intermediate frequency signal in the demodulator.

13. The automatic frequency control method as claimed in claim 1, wherein the local frequency comprises a local frequency of a quadrature wave detector which subjects the intermediate frequency signal to the quadrature wave detection in the demodulator.

14. An automatic frequency control circuit, of a demodulator which employs a $2^n$-phase phase shift keying modulation technique, where n is an integer greater than or equal to two, and which receives a signal having an intermediate frequency signal, said automatic frequency control circuit for correcting an error between a received carrier frequency and a local frequency and comprising:
- quadrature wave detector means for subjecting the intermediate frequency signal of the signal to a quadrature wave detection to output I-axis and Q-axis signals, each signal comprising amplitude components;
- first circuit means, coupled to said quadrature wave detector means, for converting the amplitude components of the I-axis and Q-axis signals into phase components, which include frequency components, and for outputting the phase components;
- second circuit means, coupled to said first circuit means, for receiving the phase components, converting the phase components into the frequency components, and for outputting the frequency components; and
- third circuit means, coupled to said second circuit means, for receiving frequency information and for correcting the local frequency depending on the frequency components.

15. The automatic frequency control circuit as claimed in claim 14, wherein said second circuit means comprises:
- a multiplier, coupled to the first circuit means, multiplying the frequency components included in the phase components output from said first circuit means by $2^n$ and outputting a multiplier output; and
- a differentiating circuit, coupled to the multiplexer, differentiating the multiplier output and outputting the frequency components.

16. The automatic frequency control circuit as claimed in claim 15, wherein said quadrature wave detector means obtains digital I-axis and Q-axis signals, and said third circuit means comprises:
- a loop filter, coupled to the differentiating circuit, filtering the frequency components output by the differentiating circuit, and outputting a loop filter output;
- a converter, coupled to the loop filter, converting the loop filter output of the loop filter into an analog signal; and
- a voltage controlled oscillator coupled to the converter and correcting the local frequency based on the analog signal output from the converter.

17. The automatic control circuit as claimed in claim 14, wherein the demodulator employs a $\pi/4$-shift quadrature phase shift keying modulation system which is a modification of the $2^n$-phase phase shift keying modulation system, and said second circuit means comprises:
- a multiplier, coupled to the first circuit means, multiplying the frequency components, included in the phase components output from said first circuit means, by 4 and outputting a multiplier result; and
- a differentiating circuit coupled to the multiplier and differentiating the multiplier result output by the multiplier.

18. The automatic frequency control circuit as claimed in claim 17, wherein said quadrature wave detector means obtains digital I-axis and Q-axis signals, said differentiating circuit outputting a differentiating result, and said third circuit means comprises:
- a loop filter, coupled to the differentiating circuit, receiving the differentiating result, filtering the differentiating result output by the differentiating circuit, and outputting a loop filter result;
- offset means coupled to the loop filter, receiving the loop filter result, offsetting the loop filter result output by the loop filter by $\frac{1}{8}$ of a symbol rate, and outputting an offset result;
- a converter, coupled to the offset means, receiving the offset result, converting the offset result output by the loop filter and which is offset by the offset means into an analog signal, and outputting the analog signal; and
- a voltage controlled oscillator, coupled to the converter, receiving the analog signal, and correcting the local frequency based on the analog signal output from the converter.

19. The automatic frequency control circuit as claimed in claim 14, wherein said second circuit means comprises means for converting the phase components into the frequency components, and said third circuit means comprises means for integrating the frequency components obtained from said second circuit means back into the phase components and for correcting the phase components obtained in said circuit means by the phase components obtained in said third circuit means.

20. The automatic phase control circuit as claimed in claim 19, wherein said second circuit means comprises:
- a multiplier multiplying the frequency components included in the phase components output from said first circuit means by $2^n$ and outputting a multiplier result; and a differentiating circuit, coupled to the multiplier, receiving the multiplier, differentiating the multiplier result output of the multiplier.

21. The automatic frequency control circuit as claimed in claim 20, wherein said quadrature wave detector means obtains digital I-axis and Q-axis signals, said differentiating circuit producing a differentiating result, and said third circuit means comprises:

- a loop filter, coupled to the differentiating circuit, filtering the differentiating result output of the differentiating circuit and outputting a loop filter result; and
- an integrating circuits coupled to the loop filter, integrating the loop filter output of the loop filter to generate the phase components.

22. The automatic frequency control circuit as claimed in claim 19, wherein the demodulator employs a $\pi/4$-shift quadrature phase shift keying modulation system which is a modification of the $2^n$-phase phase shift keying modulation system, and said second circuit means comprises:

- a multiplier multiplying the frequency components included in the phase components, output from said first circuit means by 4 and outputting a multiplier result; and
- a differentiating circuit, coupled to the multiplier, differentiating the multiplier output of the multiplier and outputting a differentiating result.

23. The automatic frequency control circuit as claimed in claim 21, wherein said quadrature wave detector means obtains digital I-axis and Q-axis signals, and said third circuit means comprises:

- a loop filter, coupled to the differentiating circuit, filtering the differentiating result output of the differentiating circuit and outputting a loop filter result;
- offset means, coupled to the loop filter, offsetting the loop filter output of the loop filter by $\frac{1}{8}$ of a symbol rate, and outputting an offset result; and
- an integrating circuit, coupled to the offset means, receiving the offset result and integrating the offset result output of the loop filter which is offset by the offset means to generate the phase components.

24. The automatic frequency control circuit as claimed in claim 14, wherein the local frequency comprises a local frequency of a mixer which generates the intermediate frequency signal in the demodulator.

25. The automatic frequency control circuit as claimed in claim 14, wherein the local frequency comprises a local frequency of a quadrature wave detector which subjects the intermediate frequency signal to the quadrature wave detection in the demodulator.

* * * * *

UNITED STATES PATENT AND TRADEMARK OFFICE
CERTIFICATE OF CORRECTION

PATENT NO. : 5,373,247
DATED : December 13, 1994
INVENTOR(S) : Hideto FURUKAWA et al.

It is certified that error appears in the above-indentified patent and that said Letters Patent is hereby corrected as shown below:

Column 1, Line 16, change "made" to --accomplished--.

Column 8, Line 14, change "aimed" to --claimed--.

Column 11, Line 27, change "means" to --means,--.

Signed and Sealed this

Twentieth Day of June, 1995

*Attest:*

BRUCE LEHMAN

*Attesting Officer*   *Commissioner of Patents and Trademarks*